United States Patent
Chen et al.

(10) Patent No.: US 8,633,738 B2
(45) Date of Patent: Jan. 21, 2014

(54) SLEW-RATE LIMITED OUTPUT DRIVER WITH OUTPUT-LOAD SENSING FEEDBACK LOOP

(75) Inventors: Wilson J. Chen, San Diego, CA (US); Chiew-Guan Tan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/368,870

(22) Filed: Feb. 8, 2012

(65) Prior Publication Data

US 2013/0181751 A1 Jul. 18, 2013

Related U.S. Application Data

(60) Provisional application No. 61/587,904, filed on Jan. 18, 2012.

(51) Int. Cl.
*H03B 1/00* (2006.01)
(52) U.S. Cl.
USPC ............................. 327/111; 327/112; 327/170
(58) Field of Classification Search
USPC ......... 327/111, 112, 155, 156, 158, 159, 161, 327/162, 163, 170, 178, 306, 317, 318, 323, 327/331, 332, 362
See application file for complete search history.

(56) References Cited

U.S. PATENT DOCUMENTS

| | | | | |
|---|---|---|---|---|
| 5,410,189 | A * | 4/1995 | Nguyen | 327/374 |
| 6,124,747 | A * | 9/2000 | Nasu | 327/281 |
| 7,880,513 | B2 * | 2/2011 | Masleid | 327/108 |
| 8,035,425 | B2 * | 10/2011 | Masleid et al. | 327/112 |
| 2004/0090255 | A1 * | 5/2004 | Ajit | 327/170 |
| 2004/0164763 | A1 | 8/2004 | Kim et al. | |
| 2009/0045834 | A1 | 2/2009 | Farwell | |
| 2010/0052758 | A1 | 3/2010 | Quan et al. | |

OTHER PUBLICATIONS

International Search Report and Written Opinion—PCT/US2013/021843—ISA/EPO—May 6, 2013.

* cited by examiner

*Primary Examiner* — Lincoln Donovan
*Assistant Examiner* — Jung H. Kim
(74) *Attorney, Agent, or Firm* — Sam Talpalatsky; Nicholas J. Pauley; Joseph Agusta (57) ABSTRACT

Output driver feedback circuitry is configured to sense an amount of output capacitance of an output pad and to adjust the strength of the output driver accordingly. The feedback circuitry adjusts the output driver within a single cycle. A chain of delay reference signals is generated by representative capacitive loads that replicate a range of actual output loads. Adjustments to the output driver are based on a comparison of the delay reference signals with output of the output driver.

15 Claims, 6 Drawing Sheets

SLEW-RATE LIMITED OUTPUT DRIVER WITH OUTPUT-LOAD SENSING FEEDBACK LOOP

CROSS REFERENCE TO RELATED APPLICATION

The present application claims the benefit of U.S. Provisional Patent Application No. 61/587,904 to Chen et al. filed on Jan. 18, 2012.

TECHNICAL FIELD

The present disclosure relates generally to semiconductor calibration circuits. More specifically, the present disclosure relates to compensating for load variations, such as variations in the capacitance of loads that are coupled to an output pad of a chip.

BACKGROUND

Integrated circuit (IC) design specifications generally include limits for the transition times and slew rates of output signals. Variations in the load capacitance coupled to output circuitry on an integrated circuit affect the slew rates and transition times of the output signals. Output interface circuitry on a chip may include capacitive feedback, which compensates for some variations in load capacitance but may not be capable of meeting stringent transition time requirements. For interfaces that are designed to provide a limited output slew rate across a very wide range of output capacitive loads, general purpose input/output (GPIO) circuitry may not be able to provide output signals that satisfy the transition time requirements, even if such circuitry includes output drivers with capacitive feedback.

Because of the continued rapid scaling of complementary metal oxide semiconductor (CMOS) technology, the use of off-chip components is becoming more expensive. Compensation techniques with off-chip process calibration that may help reduce output timing variations are therefore increasingly expensive to implement. Even presently known off-chip calibration techniques may not be effective to compensate for very wide variations in output load capacitance.

SUMMARY

Aspects of the present disclosure include feedback circuitry to sense an amount of output capacitance coupled on an output pad and to adjust the strength of the output driver accordingly. The feedback circuitry supports a wide output range without implementing a process calibration. The feedback circuit may provide sufficient adjustment of the output driver within a single cycle in which the output capacitance is not expected to change much over time.

An output driver apparatus according to an aspect of the present disclosure includes output driver circuitry coupled between a core-output node and an output pad. Capacitance sensing circuitry is coupled to the output pad. The capacitance sensing circuitry is configured for sensing output capacitance on the output pad. Feedback circuitry coupled between the capacitance sensing circuitry and the output driver circuitry is configured to adjust a driving strength of the output driver circuitry in response to the sensed output capacitance.

A method for outputting load compensation according to an aspect of the present disclosure includes generating a chain of delay reference signals in response to a first output signal and generating a second output signal by an output driver in response to the first output signal. The method also includes generating a code representing a timing difference between the second output signal and the chain of delay reference signals, and adjusting a driving strength of the output driver in response to the code.

An apparatus for output load compensation according to an aspect of the present disclosure includes means for generating a chain of delay reference signals in response to a first output signal and means for generating a second output signal by an output driver in response to the first output signal. The apparatus also includes means for generating a code representing a timing difference between the second output signal and the chain of delay reference signals, and means for adjusting a driving strength of the output driver in response to the code.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout.

DETAILED DESCRIPTION

Figure 1:
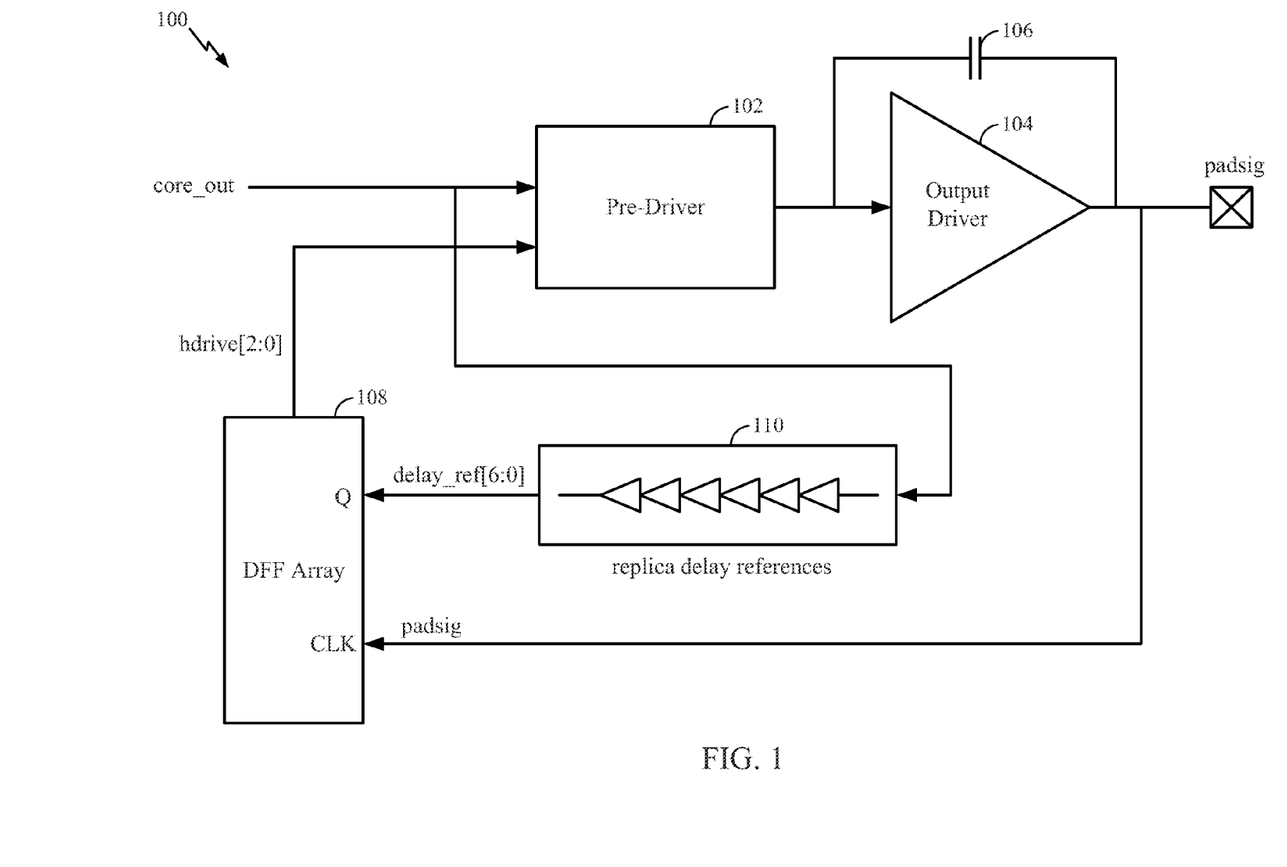
FIG. 1 is a schematic diagram conceptually illustrating a general example of calibration circuitry according to aspects of the present disclosure.

FIG. 1 shows a top level block diagram of a design architecture including circuitry 100 for adjusting an output according to aspects of the present disclosure. The circuitry 100 includes a digital pre-driver 102 coupled to an output driver 104. A capacitor 106 is coupled between an output node and an input node of the output driver 104. The capacitor 106 helps to control slew rate of an output signal from the output driver 104.

According to aspects of the present disclosure, an output load sensing feedback loop is coupled between the output node of the output driver 104 and an input of the digital pre-driver 102. The output load sensing feedback loop includes a D-flip-flop (DFF) array 108. A CLK input of the DFF array 108 is coupled to the output node of the output driver 104. Delay reference circuitry 110 is coupled between an input node of the pre-driver 102 and data inputs of the DFF array 108. The delay reference circuitry 110 includes a chain of replicas of the output driver 104.

The delay reference circuitry 110 is configured to mimic the output delay from the output driver 104 if the output driver 104 were coupled to different capacitive loads at a typical process-voltage-temperature (PVT) process corner. For example, the delay reference circuitry 110 can be configured to provide timing reference signals (delay_ref[6:0]) that include a set of delays that mirror output delay from 5 pF, 10 pF, 20 pF, 30 pF output loads and so on. The timing reference signals (delay_ref[6:0]) are compared by the INT array 108 with the actual delay (padsig) of the output driver 104. According to aspects of the disclosure, a number of components of the delay reference signal are latched by the DFF array 108 in response to a CLK input to the DFF array 108. The latched components of the timing reference signal effectively encode the timing difference between the output of the output driver 104 in response to the actual load and the output of the delay reference circuitry 110 which is based on the reference loads.

The delay reference circuitry 110 generates an array of outputs D[0], D[1], . . . D[5], D[6] which vary based on the constituent reference output load replicas in the reference circuitry. The CLK input to the DFF array 108 has a delay that is based on the actual output load that is coupled to the output driver 104. Differences between the CLK delay based on actual load capacitance and delays based on reference loads can be seen by comparing the CLK output with the array of outputs (delay_ref[6:0]). According to aspects of the present disclosure, the difference between the CLK output and the array of outputs (delay_ref[6:0]) can be used to generate a code that indicates the actual load capacitance. The code is provided to the digital pre-driver circuitry 102. The pre-driver circuitry 102 is configured to turn a different number of devices on and off in the output driver 104 in response to the code.

Figure 2:
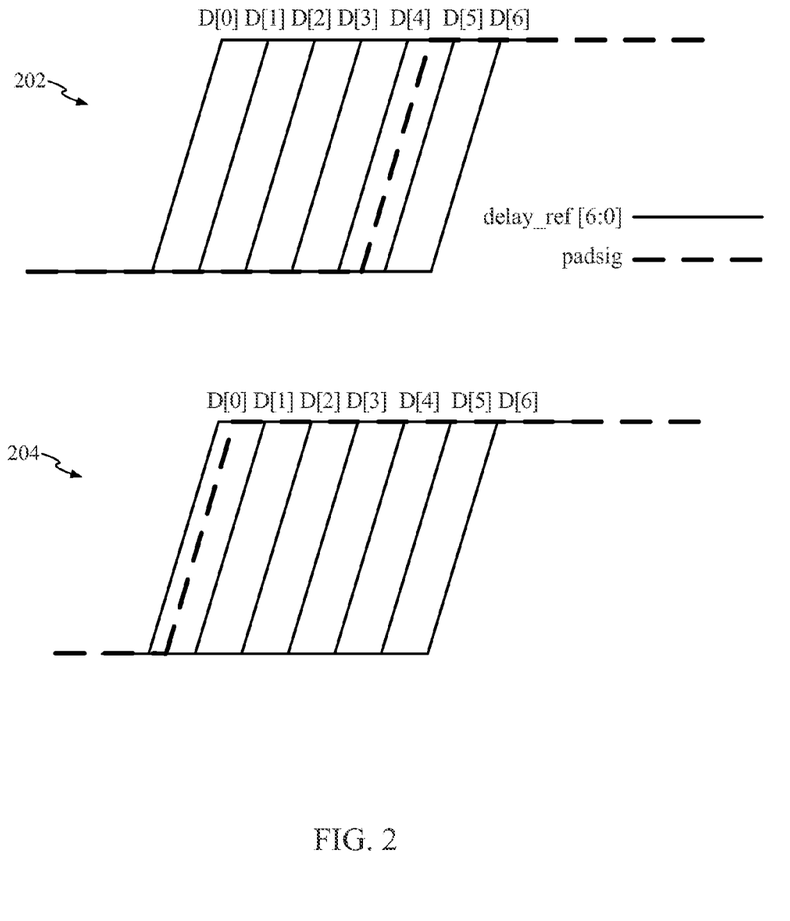
FIG. 2 is a signal timing diagram illustrating differences between an output signal delay and delay reference signals according to an aspect of the present disclosure.

Referring to FIG. 2, in a first example 204 when the output capacitive load is relatively small, the delay at padsig, which is sensed at the CLK input of the DFF array 108 is also relatively small. In this case, the DFF array 108 latches only the first constituent (bits D[0] of the timing reference signal (delay_ref[6:0]) response to the CLK input. In a second example 202 when the output capacitive load is larger, the delay at padsig becomes larger. In this case the DFF array 108 is able to sample more constituents (bits D[0]-D[4]) of the timing reference signal (delay_ref[6:0]) in response to the CLK input. In response to sampling more constituent bits of the timing reference signal, the DFF array 108 provides a larger code to the digital pre-driver circuitry 102. The digital pre-driver circuitry 102 adjusts driving strength of the output driver 104 according to this code. Adjusting the strength of the output driver 104, according to aspects of the present disclosure accommodates very widely varying output load capacitances presented on a bus and provides an output signal having an acceptable slew rate.

The apparatus 100 generates a calibration code extremely quickly and efficiently. For example, the apparatus 100 is configured to receive an input and to generate a calibration code within a single cycle time of the input. The adjustments are performed on-chip within one cycle of the output signal (CLK).

Figure 3:
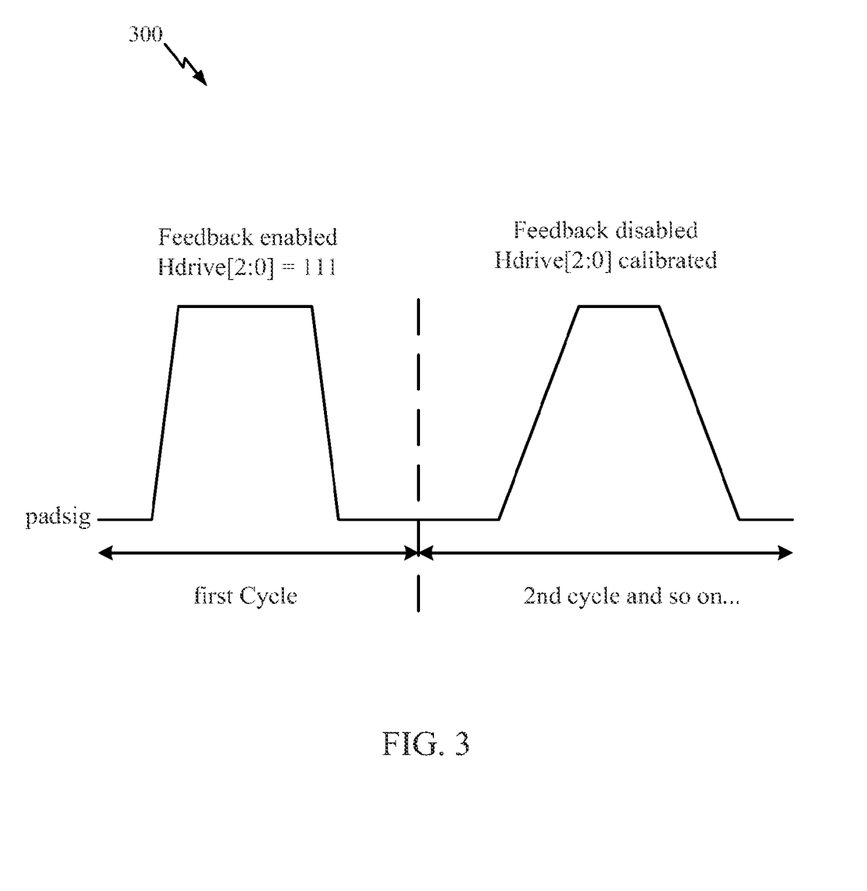
FIG. 3 is a timing diagram conceptually illustrating a cycle of the output signal in response to an output driver adjustment according to an aspect of the present disclosure.

FIG. 3 shows a timing diagram 300 of an entire process of the calibration according to an aspect of the present disclosure. According to one aspect of the present disclosure the output load sensing feedback loop is enabled and the output driver is configured with high driving strength during a first clock cycle. When the output initially rises, the I/O pad compares the timing of the first rising edge with the internal timing references and applies the calibration results to the output driver. When the second cycle arrives, the output load sensing feedback loop is disabled and the output driver has already been configured to provide the desired output driving strength. According to the present disclosure, the total amount of time thr the pad to arrive to its targeted output slew rate is only a single cycle of its own clock time.

In certain implementations, the disclosed output driver adjustment may be performed only once whenever the output path is enabled, for example, because the amount of output capacitance coupled to an output pad is usually fixed. In other implementations, the disclosed capacitive load compensation process may operate more than once or continuously. Continuous operation could be performed efficiently without having to interrupt other processing tasks and without switching back and forth between the disclosed capacitive load compensation process and other processing tasks, for example.

In one configuration, an apparatus for wireless communication includes means for generating a chain of delay reference signals in response to the first output signal. The means for generating a chain of delay reference signals may be the delay reference circuitry 110, for example. The configuration may include means, such as the output driver 104, for generating a second output signal in response to the first output signal. The configuration may include means, such as the DFF array 108, for generating a code representing a timing difference between the second output signal and the chain of delay reference signals. The configuration may also include means for adjusting the strength of the output driver in response to the code. The means for adjusting the strength of the output driver may be the digital pre-driver circuitry 102, for example. In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 4:
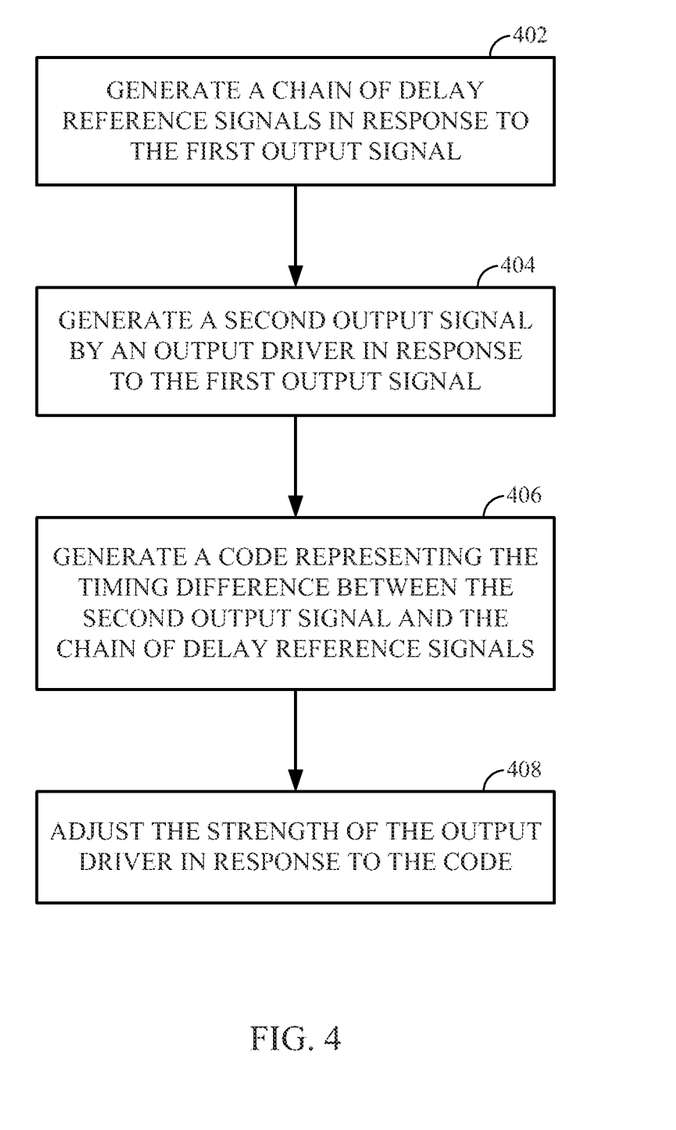
FIG. 4 is a process flow diagram illustrating a method for output load compensation according to an aspect of the present disclosure.

A method for output load compensation according to aspects of the present disclosure is described with reference to FIG. 4. In block 402, a chain of delay reference signals is generated in response to a first output signal. In block 404, a second output signal is generated by an output driver in response to the first output signal. In block 406, a code representing a timing difference between the second output signal and the chain of delay reference signals is generated. In block 408, the strength of the output driver is adjusted in response to the code.

Figure 5:
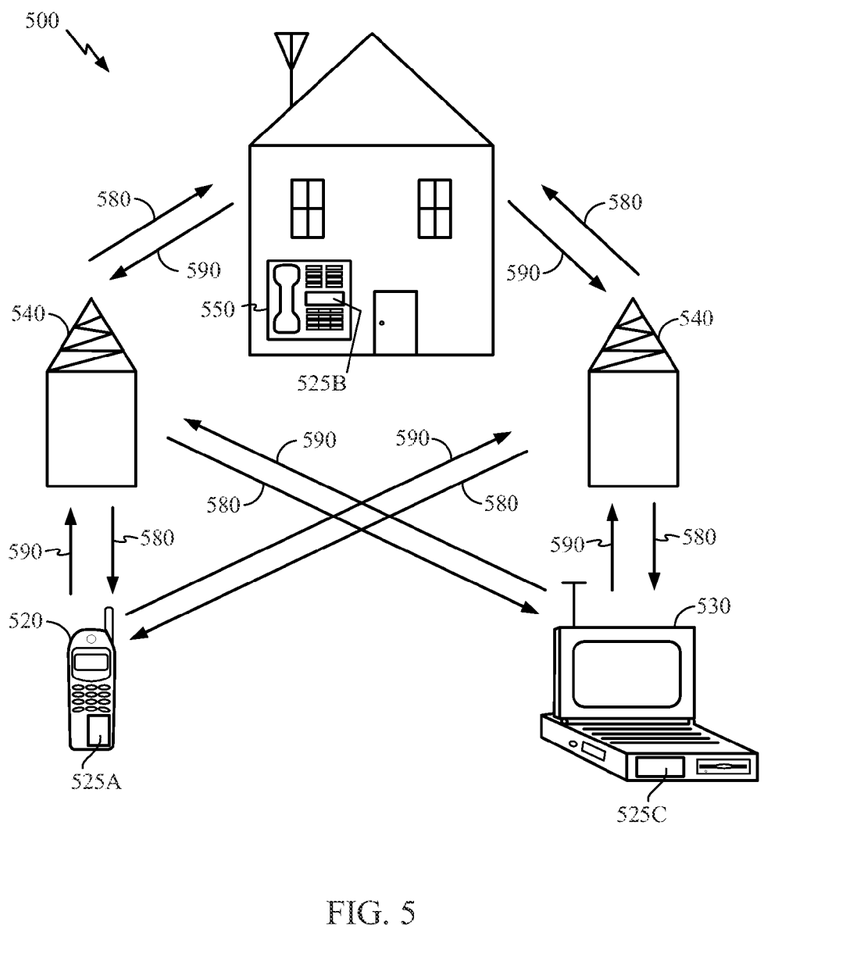
FIG. 5 shows an exemplary wireless communication system in which a configuration of the disclosure may be advantageously employed.

FIG. 5 shows an exemplary wireless communication system 500 in which a configuration of the disclosed calibration circuit may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include the calibration circuitry 525A, 525B, and 525C, respectively. FIG. 5 shows forward link signals 580 from the base stations 540 and the remote units 520, 530, and 550 and reverse link signals 590 from the remote units 520, 530, and 550 to base stations 540.

In FIG. 5, the remote unit 520 is shown as a mobile telephone, remote unit 530 is shown as a portable computer, and remote unit 550 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 5 illustrates remote units, which may employ calibration circuitry according to the teachings of the disclosure, the disclosure is not limited to these exemplary illustrated units. For instance, calibration circuitry according to configurations of the present disclosure may be suitably employed in any device.

Figure 6:
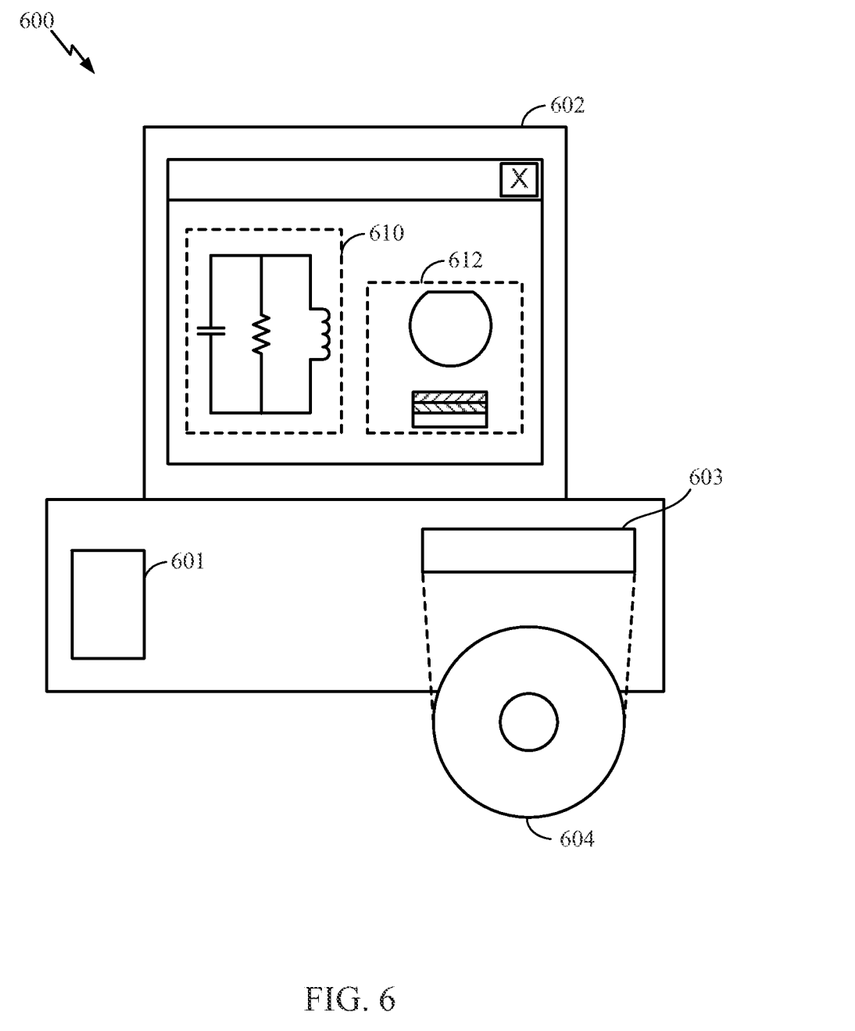
FIG. 6 is a block diagram illustrating a design workstation for circuit, layout, and logic design of a semiconductor component according to one aspect of the present disclosure.

FIG. 6 is a block diagram illustrating a design workstation used for circuit, layout, and logic design of a semiconductor component, such as the calibration circuitry disclosed above. A design workstation 600 includes a hard disk 601 containing operating system software, support files, and design software such as Cadence or OrCAD. The design workstation 600 also includes a display 602 to facilitate design of a circuit 610 or a semiconductor component 612 such as the calibration circuitry. A storage medium 604 is provided for tangibly storing the circuit design 610 or the semiconductor component 612. The circuit design 610 or the semiconductor component 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit design 610 or the semiconductor component 612 by decreasing the number of processes for designing semiconductor wafers.

Although specific circuitry has been set forth, it will be appreciated by those skilled in the art that not all of the disclosed circuitry is required to practice the disclosed configurations. Moreover, certain well known circuits have not been described, to maintain focus on the disclosure.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

if implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular configurations of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An output driver apparatus comprising:

output driver circuitry coupled between a core-output node and an output pad;

a D-flip-flop (DFF) array including a DFF array clock (CLK) input, a DFF array delay input and a DFF array output, the DFF array clock input being coupled to the output pad, and the DFF array output being coupled to the output driver circuitry, the DFF array being configured to output a code on the DFF array output in response to a difference between a signal on the DFF array clock input and each of a chain of delay reference signals on the DFF array delay input, the output driver circuitry being configured to adjust a driving strength in response to the code; and a delay line coupled between the core-output node and the DFF array delay input, the delay line configured to generate the chain of delay reference signals by applying a set of representative delays to a signal on the core-output node.

2. The apparatus of claim 1, in which the delay line comprises:
a chain of replicas of portions of the output driver circuitry, the chain of replicas being configured to approximate delays of a plurality of estimated capacitive loads on the output pad.

3. The apparatus of claim 2, in which the estimated capacitive loads correspond to a Process-Voltage-Temperature (PVT) process corner.

4. The apparatus of claim 1, further comprising feedback circuitry configured to adjust the driving strength of the output driver circuitry within a single cycle of an output signal.

5. The apparatus of claim 1, integrated in at least one of a mobile phone, a set top box, a music player, a video player, an entertainment unit, a navigation device, a computer, a hand-held personal communication systems (PCS) unit, a portable data unit, and a fixed location data unit.

6. A method for output load compensation, comprising:
generating a chain of delay reference signals in response to a first output signal by applying the first output signal to a plurality of representative capacitive loads, the delay reference signals mirroring delays caused by corresponding output loads;
generating a second output signal by an output driver in response to the first output signal;
generating a code representing a timing difference between the second output signal and the chain of delay reference signals by applying the chain of delay reference signals to a plurality of corresponding D-flip flops (DFFs) in a DFF array, respectively, and by applying the second output signal to a clock input of the DFF array; and
adjusting a driving strength of the output driver in response to the code.

7. The method of claim 6, in which generating the second output signal further comprises:
applying the first output signal to digital pre-driver circuitry to generate a pre-driver output; and
applying the pre-driver output to the output driver.

8. The method of claim 7 in which adjusting the driving strength of the output driver further comprises:
applying output of the DFF array to the digital pre-driver circuitry.

9. The method of claim 6, further comprising integrating the output driver into at least one of a mobile phone, a set top box, a music player, a video player, an entertainment unit, a navigation device, a computer, a hand-held personal communication systems (PCS) unit, a portable data unit, and a fixed location data unit.

10. An apparatus for output load compensation:
means for generating a chain of delay reference signals in response to a first output signal by applying the first output signal to a plurality of representative capacitive loads, the delay reference signals mirroring delays caused by corresponding output loads;
means for generating a second output signal by an output driver in response to the first output signal;
means for generating a code representing a timing difference between the second output signal and the chain of delay reference signals by applying the chain of delay reference signals to a plurality of corresponding D-flip flops (DFFs) in a DFF array, respectively, and by applying the second output signal to a clock input of the DFF array; and
means for adjusting a driving strength of the output driver in response to the code.

11. The apparatus of claim 10, in which the means for generating the second output signal further comprises:
means for applying the first output signal to digital pre-driver circuitry to generate a pre-driver output; and
means for applying the pre-driver output to the output driver.

12. The apparatus of claim 11 in which the means for adjusting the driving strength of the output driver further comprises:
means for applying output of the DFF array to the digital pre-driver circuitry.

13. The apparatus of claim 10, integrated into at least one of a mobile phone, a set top box, a music player, a video player, an entertainment unit, a navigation device, a computer, a hand-held personal communication systems (PCS) unit, a portable data unit, and a fixed location data unit.

14. A method for output load compensation comprising steps of:
generating a chain of delay reference signals in response to a first output signal by applying the first output signal to a plurality of representative capacitive loads, the delay reference signals mirroring delays caused by corresponding output loads;
generating a second output signal by an output driver in response to the first output signal;
generating a code representing a timing difference between the second output signal and the chain of delay reference signals by applying the chain of delay reference signals to a plurality of corresponding D-flip flops (DFFs) in a DFF array, respectively, and by applying the second output signal to a clock input of the DFF array; and
adjusting a driving strength of the output driver in response to the code.

15. The method of claim 14, further comprising a step of: integrating the output driver into at least one of a mobile phone, a set top box, a music player, a video player, an entertainment unit, a navigation device, a computer, a hand-held personal communication systems (PCS) unit, a portable data unit, and a fixed location data unit.

* * * * *